United States Patent [19]

Endo et al.

[11] Patent Number: 4,841,545
[45] Date of Patent: Jun. 20, 1989

[54] SYNCHRONOUS TRACKING DEVICE FOR DIRECT SPREAD SPECTRUM RECEIVER

[75] Inventors: Akihiko Endo; Shigeki Takeda; Hiroshi Takeda, all of Tokyo, Japan

[73] Assignee: Kyocera Corporation, Kyoto, Japan

[21] Appl. No.: 76,185

[22] Filed: Jul. 21, 1987

[30] Foreign Application Priority Data

Aug. 6, 1986 [JP] Japan .......................................... 185819

[51] Int. Cl.$^4$ ............................................. H04B 15/00
[52] U.S. Cl. ................................................. 375/1; 380/34
[58] Field of Search ............................... 375/1; 380/34

[56] References Cited

U.S. PATENT DOCUMENTS

| | | | |
|---|---|---|---|
| 3,402,265 | 9/1968 | Couvillon | 375/1 |
| 4,048,563 | 9/1977 | Osborne | 375/1 |
| 4,092,601 | 5/1978 | Lee et al. | 375/1 |
| 4,221,005 | 9/1980 | La Flame | 375/1 |
| 4,291,409 | 9/1981 | Weinberg et al. | 375/1 |
| 4,538,280 | 8/1985 | Mosley, Jr. et al. | 375/1 |
| 4,550,414 | 10/1985 | Guinon et al. | 375/1 |
| 4,587,662 | 5/1986 | Langewellpott | 375/1 |
| 4,656,642 | 4/1987 | Apostolos et al. | 375/1 |
| 4,701,934 | 10/1987 | Jasper | 375/1 |
| 3,760,586 | 7/1988 | Takeda | 375/1 |

OTHER PUBLICATIONS

R. C. Dixon, Spread Spectrum Systems, 2d Ed. 1984, pp. 186-213 (Baseband Recovery) pp. 248-260 (Tracking).

3/21/87 Prior Art Citations in Ser. No. 823,932 filed 1/29/86, now abandoned (Same Assignee: Kyocera Corp).

*Primary Examiner*—Salvatore Cangialosi
*Attorney, Agent, or Firm*—Spensley, Horn, Jubas & Lubitz

[57] ABSTRACT

A synchronous tracking device for a receiver in a direct-spread spectrum communication system in which a carrier frequency and a pseudo noise code for spreading it are coherent. A first circuit tracks the pseudo noise code in the received signal for a predetermined time after synchronous acquisition of the pseudo noise code. A second circuit tracks the pseudo noise code after the first tracking circuit stops tracking, while maintaining a locking condition achieved by the first tracking circuit.

24 Claims, 2 Drawing Sheets

SYNCHRONOUS TRACKING DEVICE FOR DIRECT SPREAD SPECTRUM RECEIVER

BACKGROUND OF THE INVENTION

1. Field of the Invention

The present invention relates to a synchronous tracking device for a receiver for spread spectrum communication in a carrier-coherent system in which the clock of a pseudo noise code is equal to a quotient of the carrier frequency divided by an integer, or the clocks of the pseudo noise (PN) code and the carrier are obtained from a common frequency source.

2. Background of the Invention

FIG. 1 shows a conventional transmitter for spread spectrum communication in a carrier-coherent system. The output from a common frequency source, oscillator 30, is common to a modulator 35, a one-N-th frequency divider 31, and a one-M-th frequency divider 32. The outputs from the dividers 31 and 32 are respectively supplied to a pseudo noise generator 33 and a data generator 34. A signal modulated by the modulator 35 via Exclusive OR (XOR) gates 35a, 35b is transmitted as signal S.

FIG. 2 shows a conventional receiver including a Costas demodulator loop 200, which is appropriate to recover the received data from a corresponding received signal S'. This conventional Costas loop has a voltage-controlled oscillator (VCO) 14, a phase shifter 18, three multipliers 16, 17 and 22, low pass filters (LPF) 19 and 20, and a loop filter 21. The received signal S' is despread by a multiplier 1. The output of the multiplier 1 is applied to a band pass filter 4 to thereby cut off noise outside of the filter's pass band. The output of band pass filter 4 is supplied to the Costas loop 200 to recover received data. The Costas loop 200 includes VCO 14, the output of which is applied to a multiplier 24 via a frequency multiplying unit 23 to reduce the frequency of the received signal. The received signal frequency is reduced thereby to facilitate further signal processing.

The band pass filter 4 included in the conventional receiver shown in FIG. 2 is generally made of a narrow band pass filter to render the ratio of carrier to noise (C/N ratio) large. Accordingly, such a band pass filter 4 causes a delay in the Costas loop. If there is delay in the Costas loop, the loop's gain and frequency response are limited so that the loop's lock range and capture range cannot be widened. For that reason, even if the phase of the local pseudo noise code of the receiver temporarily coincides with that of the pseudo noise code of the received signal input to the receiver, capture or locking-in cannot be performed in some cases, making it impossible to recover the data transmitted.

SUMMARY OF THE INVENTION

The present invention was made in order to solve the above-mentioned problem.

Accordingly, it is an object of the present invention to provide a receiver for spread spectrum communication, in which a delay lock loop (DLL) tracks a pseudo noise (PN) code in the received signal for a predetermined time after the synchronous acquisition of the PN code. After the predetermined time, a Costas loop takes over tracking the PN code for locking-in instead of the delay lock loop. Stable synchronous tracking is thus enabled.

In the receiver for spread spectrum communication according to the invention, a carrier component and the PN code spreading it are in a coherent relation to each other. After the synchronous acquisition of the PN code, the delay lock loop synchronously tracks the PN code in the received signal for the predetermined time. When the tracking action of the receiver on the PN code has become stable in the delay lock loop, the synchronous tracking is then performed by the Costas loop, which is capable of adequately tracking the higher frequency carrier component, instead of the delay lock loop.

After the synchronous acquisition of the PN code, the input wave received by the receiver is tracked by the delay lock loop. After a predetermined time interval, the delay lock loop (DLL) tracking is turned off and then instead the tracking is performed by the Costas loop on the carrier component so as to lock-in the loops. Since the frequency of the voltage-controlled oscillator becomes the value for the locking in the delay lock loop, locking is afterwards easily obtained in the Costas loop even if its capture range is narrow. A stable synchronous tracking device is thus provided.

DETAILED DESCRIPTION OF THE PREFERRED EMBODIMENTS

Figure 1:
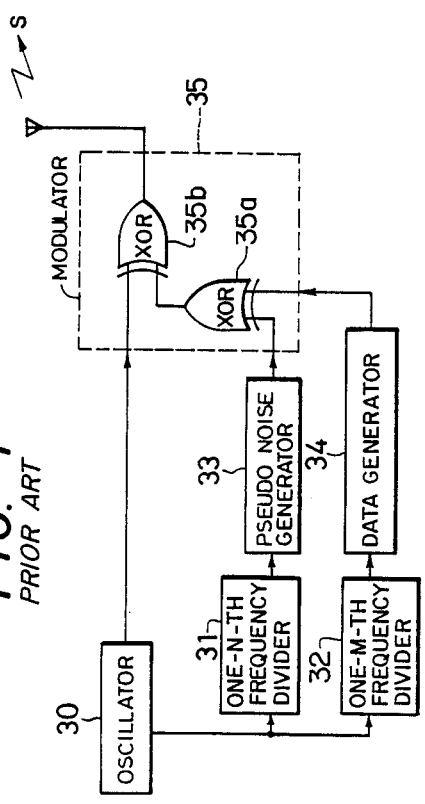
FIG. 1 shows a block diagram of a conventional transmitter for spectrum-diffusion communication in a carrier coherence direct-spread system.
Figure 2:
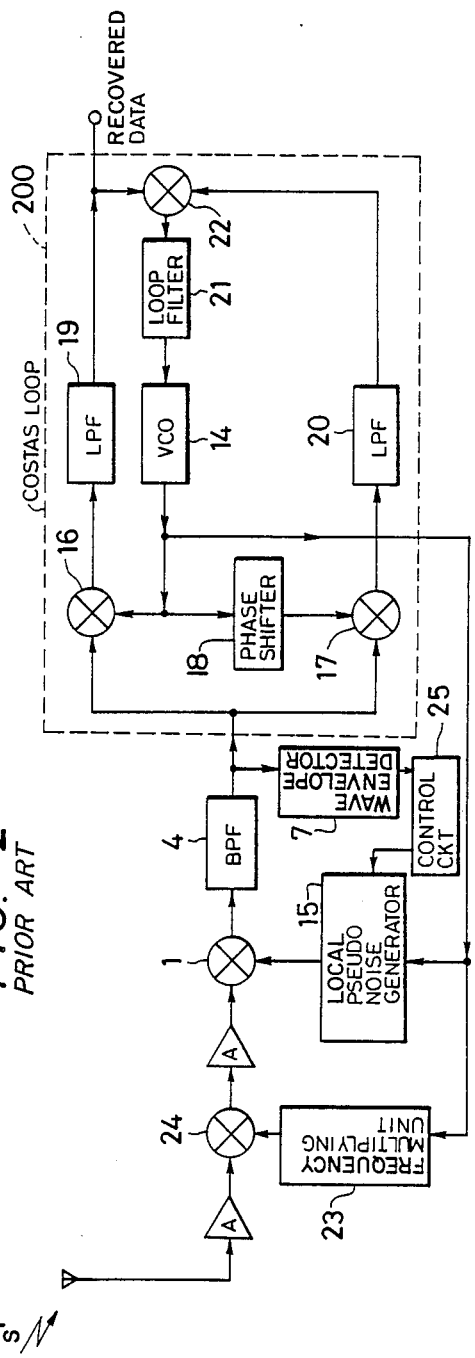
FIG. 2 shows a block diagram of a conventional receiver to receive the signal sent by the transmitter of FIG. 1.
Figure 3:
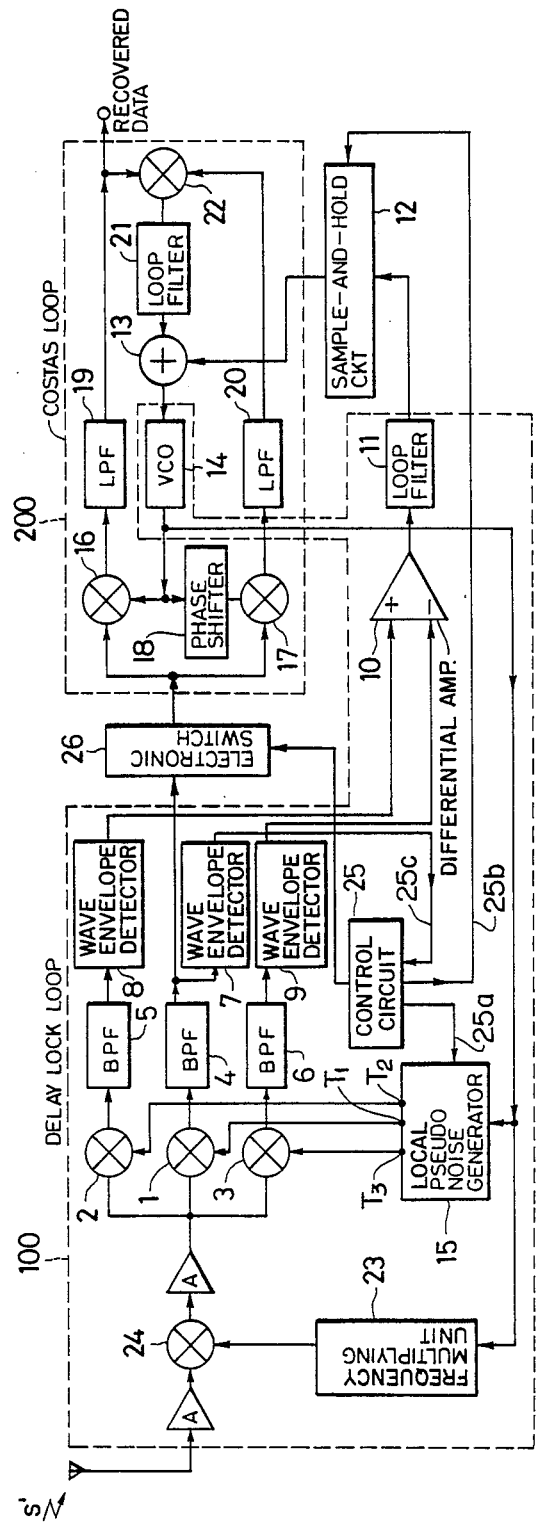
FIG. 3 shows a block diagram of a receiver which is an embodiment of the present invention.

FIG. 3 shows a block diagram of a receiver embodying the present invention. In FIGS. 2 and 3, like parts and components are designated by the same reference numbers. The transmitter corresponding to the receiver is the same conventional one shown in FIG. 1.

A delay lock loop 100 shown in FIG. 3 has two additional PN code signals having the same pattern but a phase difference of one chip interval. These are supplied from the terminals $T_2$ and $T_3$ of a local pseudo noise generator 15 (which also has an intermediate conventional output terminal $T_1$) to two corresponding multipliers 2 and 3. The outputs of multipliers 2 and 3 are respectively applied through band pass filters 5 and 6 to wave envelope detectors 8 and 9. The difference between the outputs of the detectors 8 and 9 is determined by a differential amplifier 10. The output of the differential amplifier 10 is filtered by a loop filter 11 and supplied to a sample-and-hold circuit 12 which is triggered by a line 25b from a control circuit 25. The output of the sample-and-hold circuit is supplied as feedback via an adder 13 to adjust a voltage-controlled oscillator (VCO) 14 to generate an output which is supplied for timing to the local pseudo noise generator 15.

A Costas loop 200 shown in FIG. 3 is the same as that shown in FIG. 2, except for inclusion of the two-input adder 13 between VCO 14 and loop filter 21.

The operation of the receiver shown in FIG. 3 will now be described. For acquisition (coarse synchronization), a PN code is supplied from the local pseudo noise generator at terminal $T_1$ to a multiplier 1 in order to obtain sliding correlation between the PN code in the received signal and that locally generated by PN generator 15. A control circuit 25 controls generator 15 so that when synchronization of the two PN codes is detected by the output of a wave envelope detector 7, the synchronous acquisition stage is completed and tracking (fine synchronization) of the PN codes by the delay lock loop 100 begins. In such tracking, however, stable synchronization cannot be maintained with the carrier component, which has a frequency higher than the clock of the pseudo noise generator. For that reason, the sample-and-hold circuit 12 is operated by control circuit 25's control line 25b after a predetermined interval allowing for the response time of the loop filter 11 to freeze the feedback control voltage to the VCO 14 via adder 13, causing the delay lock loop 100 to stop operating. When the delay lock loop 100 stops operating, the stable control voltage applied by adder 13 to the voltage-controlled oscillator 14 maintains the frequency coincidence of VCO 14 achieved by the tracking with the delay lock loop 100.

Just before or after the delay lock loop 100 stops operating, a normally open electronic switch 26 (for example a PIN diode) is closed by control line 25c to operate the Costas loop 200. When tracking is performed by the Costas loop 200, the tracking can be adequately performed as to the high frequency carrier component. In the condition of the tracking by the Costas loop 200, the tracking can also be performed as to the lower frequency PN code, which is coherent with the carrier component. Thus, the tracking operation is changed from the delay lock loop 100 to the Costas loop 200 by regulating the sample-and-hold circuit 12 (via line 25b) and the electronic switch 26 (via line 25c), which are controlled by the timing control signals of the control circuit 25. If desired, the start of the timing control action can be selectively chosen relative to the time points of the turn-on of the receiver, the reception of the input signal to the receiver, the detection of the detection output from the detector 8 and/or the detector 9, or the like.

Therefore, according to the invention, after the synchronous acquisition of the PN code, the input wave received by the receiver is tracked by the delay lock loop 100. After the tracking terminates, delay lock loop 100 is turned off and Costas loop 200 begins tracking instead of the delay lock loop so as to lock-in the loops. Since the frequency of the voltage-controlled oscillator becomes the value locking the delay lock loop 100, locking is easily obtained in the Costas loop even if its capture range is narrow. A stable synchronous tracking device is thus provided.

What is claimed is:

1. A synchronous tracking device for a receiver in a direct-spread spectrum communication system in which a carrier frequency and a pseudo noise code are coherent with each other, comprising:
   first tracking means, including a shared controlled oscillator, for tracking said pseudo noise code for a predetermined time after the synchronous acquisition; and
   second tracking means, including said same shared controlled oscillator, for tracking said carrier frequency after said first tracking means stops tracking, while maintaining in said same shared controlled oscillator a locking condition achieved by said first tracking means.

2. The synchronous tracking device of claim 1, further comprising:
   means for switching the tracking operation from said first tracking means to said second tracking means; and
   means for sampling and holding a feedback signal of said first tracking means.

3. A synchronous tracking device of claim 2, wherein said switching means comprises an electronic switch formed of a PIN diode.

4. The synchronous tracking device of claim 1 wherein said second tracking means is a costas loop.

5. The synchronous tracking device of claim 1 wherein said controlled oscillator is a voltage-controlled oscillator.

6. The synchronous tracking device of claim 5 further comprising means for maintaining a feedback voltage applied to said voltage-controlled oscillator.

7. A receiver tracking circuit for a direct-spread spectrum system in which a received signal derives from a transmitter carrier modulated by a data signal and spread by a coherent pseudonoise (PN) signal, comprising:
   initial tracking means for locking on the coherent PN signal in the received signal, including shared controlled oscillator means having first and second feedback inputs, for generating a local carrier, and a local PN generator synchronized to the local carrier for generating a local PN signal to be locked onto the coherent PN signal, and PN tracking error detector means for providing a first error signal coupled as a first correction signal to the first feedback input;
   despreading means for applying the local PN signal to the received signal to produce a despread signal;
   final tracking means for locking on the despread signal, including the shared controlled oscillator means, the local carrier of which is to be locked on the despread signal, and phase error detector means for providing a second correction signal to the second feedback input; and
   control means for holding the first correction signal at its current value and starting the final tracking means when the initial tracking means has locked on the coherent PN signal.

8. The receiver tracking circuit of claim 7 wherein the shared controlled oscillator is a voltage controlled oscillator.

9. The receiver tracking circuit of claim 7 wherein the initial tracking means includes a delay-locked loop.

10. The receiver tracking circuit of claim 9 wherein the final tracking means includes a Costas loop.

11. The receiver tracking circuit of claim 7 wherein the final tracking means includes a Costas loop.

12. The receiver tracking circuit of claim 7 wherein the first and second feedback inputs are additively coupled.

13. The receiver tracking circuit of claim 7 wherein the PN tracking error detector means is for providing a first error signal corresponding to the phase difference between the received and local PN signals.

14. The receiver tracking circuit of claim 7 wherein the phase error detector means is for providing a second correction signal corresponding to the phase difference between the despread signal and the local carrier.

15. The receiver tracking circuit of claim 7 wherein the control means includes means for halting the initial tracking means by holding the first correction signal at its current value.

16. The receiver tracking circuit of claim 7 wherein the control means includes sample and hold means for selectively coupling the first error signal to the first correction signal.

17. The receiver tracking circuit of claim 16 wherein the control means includes switch means for starting the fine tracking means by coupling the despread signal as an input to the final tracking means.

18. The tracking device of claim 17 wherein the switch means closes a normally open PIN diode to couple the despread signal as an input to the final tracking means.

19. The receiver tracking circuit of claim 7 wherein the control means includes switch means for starting the final tracking means by coupling the despread signal as an input to the final tracking means.

20. The receiver tracking circuit of claim 7 wherein the final tracking means includes demodulator means for applying the local carrier to the despread signal to demodulate it to recover the data signal.

21. The receiver tracking circuit of claim 7 further including acquisition means coupled to the PN generator for receiving the local PN signal and for timing control, and responsive to the received signal and the local PN signal for coarsely synchronizing the PN signal to the coherent PN signal in the received signal.

22. The receiver tracking circuit of claim 7 further including frequency multiplying means responsive to the local carrier for generating a frequency-reducing signal whose frequency is a multiple of the local carrier's frequency but a fraction of the frequency of the transmitter carrier; and amplitude multiplier means for multiplying the received signal by the frequency-reducing signal to reduce the frequency of the received signal to an intermediate frequency (IF) before it is input to the initial and final tracking means and the despreading means.

23. A tracking circuit comprising:
a delay locked loop having a first phase detector responsive to a received signal, a sample and hold circuit responsive to the phase detector, an adder and a shared controlled oscillator responsive to the sample and hold circuit, and a pseudonoise generator, the pseudonoise generator being responsive to said shared controlled oscillator to supply the first phase detector a local pseudonoise signal for phase comparison with the received signal;
a despreader circuit responsive to the received signal and the local pseudonoise signal to produce a despread signal;
a Costas loop including (i) a second phase detector responsive to the despread signal, and (ii) the adder and said shared same controlled oscillator responsive to the second phase detector; and
a control circuit having a normally open controllable switch for selectively coupling the received signal to the despreader, and means for selectively triggering the sample and hold circuit.

24. A method of tracking a received signal derived from a transmitter carrier modulated by a data signal and spread by a coherent pseudonoise (PN) signal, comprising the steps of:
(a) providing an initial tracking circuit having a shared controlled oscillator with first and second feedback inputs, a local PN generator synchronized to the shared controlled oscillator, and a PN tracking error detector circuit;
(b) initially tracking the coherent PN signal in the received signal by (i) generating a local PN signal by means of the local PN generator for locking on the coherent PN signal, (ii) generating by means of the PN tracking error detector circuit a first error signal corresponding to the phase difference between the received and local PN signals, and (iii) coupling the first error signal as a first correction signal to the first feedback input;
(c) providing despreading means for applying the local PN signal to the received signal to produce a despread signal;
(d) providing a final tracking circuit including the shared controlled oscillator and the phase error detector circuit; and
(e) when the initial tracking circuit has locked on the coherent PN signal, finally tracking the despread signal by means of the final tracking circuit by (i) generating a second correction signal corresponding to the phase difference between the despread signal and the local carrier, (ii) providing the second correction signal to the second feedback input, and (iii) halting the initial tracking circuit by holding the first correction signal at its current value.

* * * * *